United States Patent [19]
Hatten et al.

[11] Patent Number: 4,991,185
[45] Date of Patent: Feb. 5, 1991

[54] METHOD OF TESTING N-BIT PROGRAMMABLE COUNTERS

[75] Inventors: David Hatten, Belvidere; Joe Foster, Rockford; Walter Fry, Rockford; Barry Drager, Rockford; Abdul Rashid, Rockford, all of Ill.

[73] Assignee: Sundstrand Corporation, Rockford, Ill.

[21] Appl. No.: 460,500

[22] Filed: Jan. 3, 1990

[51] Int. Cl.$^5$ ............................................. H03K 21/40
[52] U.S. Cl. ..................................... 377/29; 365/201; 371/24
[58] Field of Search ..................... 377/29, 28; 365/201; 371/24

[56] References Cited

U.S. PATENT DOCUMENTS

| | | | |
|---|---|---|---|
| 4,661,930 | 4/1987 | Tran | 365/201 |
| 4,757,523 | 7/1988 | Tran | 377/29 |
| 4,860,325 | 8/1989 | Aria et al. | 377/29 |

FOREIGN PATENT DOCUMENTS 0084318 4/1988 Japan ................................. 377/29

Primary Examiner—John S. Heyman
Attorney, Agent, or Firm—David H. Hitt

[57] ABSTRACT

This invention relates to a method of testing an n-bit programmable counter. It is desired to test the n-bit programmable counter in fewer than $2^n$ cycles. Accordingly, a counter value output on the counter is coupled to a variable increment rate input on the counter. Each bit of the counter is reset to a binary 0 initial state. A binary 1 state is loaded into a carry-in bit of the counter and the counter is iteratively doubled, by means of the coupling between the counter value output and the variable increment rate input, until a carry-out bit of the counter assumes the binary 1 state to thereby allow the counter to be fully tested in $n+1$ iterations. The counter value output and the variable increment rate input are decoupled from the counter when the counter is not being tested. The counter is provided with a parallel load input to allow simultaneous resetting of each bit. Intermediate counter values may be checked to provide a means for localizing errors within the counter.

16 Claims, 2 Drawing Sheets

METHOD OF TESTING N-BIT PROGRAMMABLE COUNTERS

TECHNICAL FIELD

This invention relates to n-bit programmable counters of the type used in VLSI digital circuitry and more specifically to a method for controlling testing and observing such counters which is efficient in terms of time and test hardware required.

BACKGROUND ART

A programmable counter is a digital device which stores a number and increments or decrements that number on command. Such counters can supply a signal when the number stored within the counter reaches a certain value. In addition, such counters are able to supply the number stored within to other devices via a parallel output data path. The counter of the subject is embedded in a very large scale integrated ("VLSI") device and, as such, is relatively inaccessible to typical test apparatus (e.g. logic probes).

Following manufacture or during operation, these counters within the VLSI device may malfunction, resulting in an inability to store or count in the desired manner. Therefore, it becomes essential to test all bits of the counter to determine whether any design or fabrication errors or faults exist therein.

Classically, in an n-bit binary counter, there are $2^n$ states or numbers which can be represented in the counter. Accordingly, prior art counter testing methods included those which test the counter by forcing it to assume sequentially each of the $2^n$ states. These methods were extremely time consuming and repetitious. Therefore, there has been a quest to find more efficient and expeditious methods for testing an n-bit counter.

One such method is described in U.S. Pat. No. 4,661,930, which issued on Apr. 28, 1987 to Tran, directed to a register of the type used as an address counter in a dynamic RAM. The counter is tested by a method which does not require cycling through every possible value of the registered contents. The counter is first loaded with a fixed value, all 1's or all 0's, and the contents checked by an AND or OR gate, producing a 1-bit output which is monitored off-chip. Then, a carry feedback path to the counter register is altered, as by inverting all but the least significant bit, and the contents again checked, using the 1-bit output via the AND or OR. In this manner, the operation of the counter is tested in three cycles.

Tran shows a method for testing an n-bit counter in three steps, regardless of the number of bits in the counter.

However, Tran requires construction of an external apparatus to check the counter, namely an apparatus which includes AND and OR gates, a signal inverter and a counter decoder. Although this apparatus allows the test to be performed in only three cycles, it is complex and relatively costly.

It is desired to test an n-bit counter in the least time while achieving the maximum level of assurance as to the accuracy and completeness of the test ("fault coverage"). It is also desired to test the counter without requiring external hardware components.

The subject invention, therefore, was developed to allow an n-bit counter to be tested in $n+1$ cycles, without requiring external hardware components. The subject invention is designed to allow the counter to be tested as part of an initialization routine performed during startup (power-up) in its operating environment.

DISCLOSURE OF INVENTION

It is therefore a primary object of the subject invention to provide a method of testing an n-bit programmable counter, comprising the steps of resetting each bit of the counter to a 0 initial state, loading a different state into a carry-in bit of the counter and iteratively doubling the counter until a carry-out bit of the counter assumes the different state to thereby allow the counter to be fully tested in $n+1$ iterations.

It is also a primary object of the invention to provide a method of testing an n-bit counter which does not require external hardware components such as gates, signal inverters and counter decoders.

Another object of the invention is to provide a method for testing an n-bit programmable counter wherein doubling is achieved by coupling a counter value output on the counter to a variable increment rate input on the counter and providing a clock pulse to a clock input on the counter.

Still another object of the invention is to provide a method of testing an n-bit programmable counter wherein a counter value output and a variable increment rate input are decoupled when the counter is not being tested.

A still further object of the invention is to provide a method of testing an n-bit programmable counter wherein the counter is provided with a parallel load input to allow simultaneous resetting of each bit therein.

Yet a further object of the invention is to provide a method of testing an n-bit programmable counter wherein the counter is provided with an overflow output.

Still another object of the invention is to provide a method of testing an n-bit programmable counter wherein intermediate counter values are checked.

A final object of this invention is to provide an n-bit programmable counter configured for testing, comprising a circuit for resetting each bit of the counter to a 0 initial state, a circuit for loading a different state into a carry-in bit of the counter and a circuit for coupling a counter value output on the counter to a variable increment rate input on the counter and providing a clock pulse to a clock input on the counter to thereby iteratively double the counter until a carry-out bit of the counter assumes the different state to allow the counter to be fully tested in $n+1$ iterations.

In the attainment of the foregoing objects, the method that encompasses the preferred embodiment of the invention is a method for testing an n-bit programmable counter, comprising the steps of resetting each bit of the counter to a binary 0 initial state and loading a binary 1 state into a carry-in bit of the counter. The counter is iteratively doubled until a carry-out bit of the counter assumes the binary 1 state. The doubling is achieved by coupling a counter value output on the counter to a variable increment rate input on the counter and providing a clock pulse to a clock input on the counter to thereby allow the counter to be fully tested in $n+1$ interactions. The counter value output and the variable increment rate input are decoupled when the counter is not being tested. Intermediate counter values may be checked to localize errors within the n-bit counter.

Other objects and advantages of the subject invention will be apparent upon reference to the accompanying description when taken in conjunction with the following drawings:

BEST MODE FOR CARRYING OUT INVENTION

Figure 1:
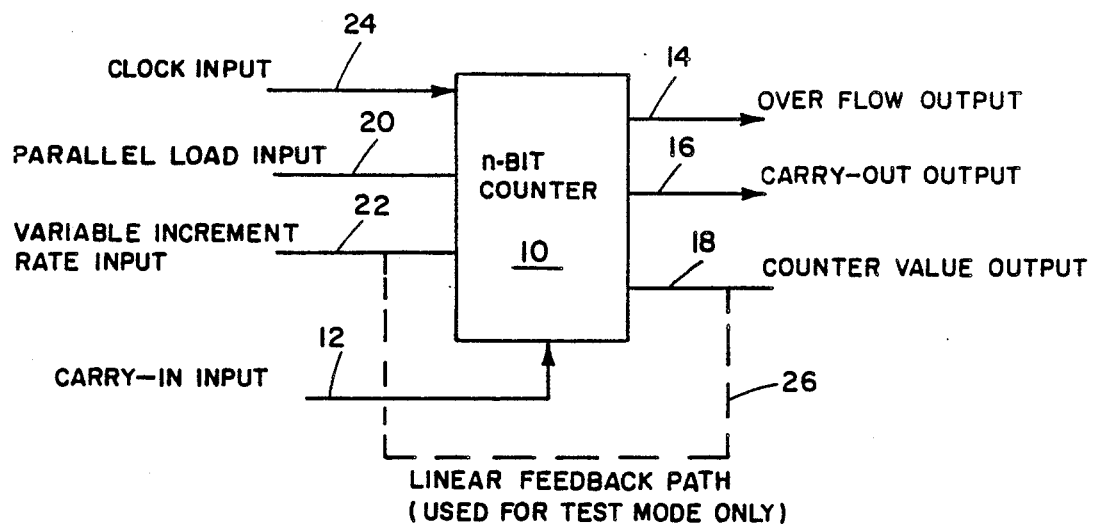
FIG. 1 is a block diagram of the n-bit programmable counter as configured for testing.

FIG. 1 is a block diagram of the n-bit programmable counter as configured for testing. The n-bit counter 10 has an internal n-bit wide register which allows the storage of binary digits representing a particular numerical value therein. The n-bit counter is provided with a carry-in input 12 which allows a binary digit to be fed to the n-bit counter 10. The digit in the carry-in input 12 affects the least significant digit within the register of the counter 10.

The n-bit counter is further provided with an overflow output 14 which indicates that the most significant bit of the register within the n-bit counter 10 has assumed a binary 1 state and, thus, that the n-bit counter 10 has overflowed. The overflow output 14 is typically used as an input to another device (usually a carry-in input of another counter) to enable the other device to ready itself to receive the overflow. The overflow itself is provided to the other device via a carry-out output 16 of the n-bit counter 10. When the n-bit counter 10 is called upon to store a number larger then its capacity, it will provide the overflow, originating at the most significant bit within the register of the n-bit counter 10, to the carry-out output 16 to enable the overflow to be used by the other device.

The n-bit counter 10 is further provided with a counter value output 18. The counter value output 18 is allows an external device to read the value of the counter 10 register at any time.

The n-bit counter 10 is provided with a parallel load input 20 The parallel load input 20 functions in a manner analogous to the counter value output 18 in that values may be supplied to the n-bit counter 10 in parallel through the parallel load input 20. Thus, other devices may provide the n-bit counter 10 with a particular binary value.

The n-bit counter 10 is provided with a variable increment rate input 22. The variable increment rate input 22 determines the rate at which the n-bit counter 10 increments or decrements the value stored in the register in the n-bit counter 10. Thus, if the variable increment rate input 22 contains a value of binary 2, the n-bit counter 10 increments by 2 the value within the register of the n-bit counter 10 when commanded to do so. Commands to store, increment or decrement are provided by a clock input 24. When a pulse appears on the clock input 24, the n-bit counter either stores a value provided on the parallel load input 20 or increments or decrements a value already stored in the register in the n-bit counter 10 according to a rate stored in the variable increment rate input 22.

The essence of the subject invention is to couple the counter value output 18 to the variable increment rate input 22 via a linear feedback path 26. The linear feedback path 26 is an n-bit wide path coupling the n-bit wide counter value output 18 and the n-bit wide variable increment rate input 22. The linear feedback path 26 is only established for purposes of testing the n-bit counter 10 and is disabled when the n-bit counter 10 is not being tested. The linear feedback path 26 receives the value of the register within the n-bit counter 10 via the counter value output 18 and forces the variable increment rate input 22 to assume that value. Thus, if the value of the register within the n-bit counter 10 is a binary 4, the variable increment rate input 22 will assume the binary value 4 and, thus, when a pulse is provided on the clock input 24, the register within the n-bit counter 10 will increment by 4, resulting in a new register value of 8.

Figure 2:
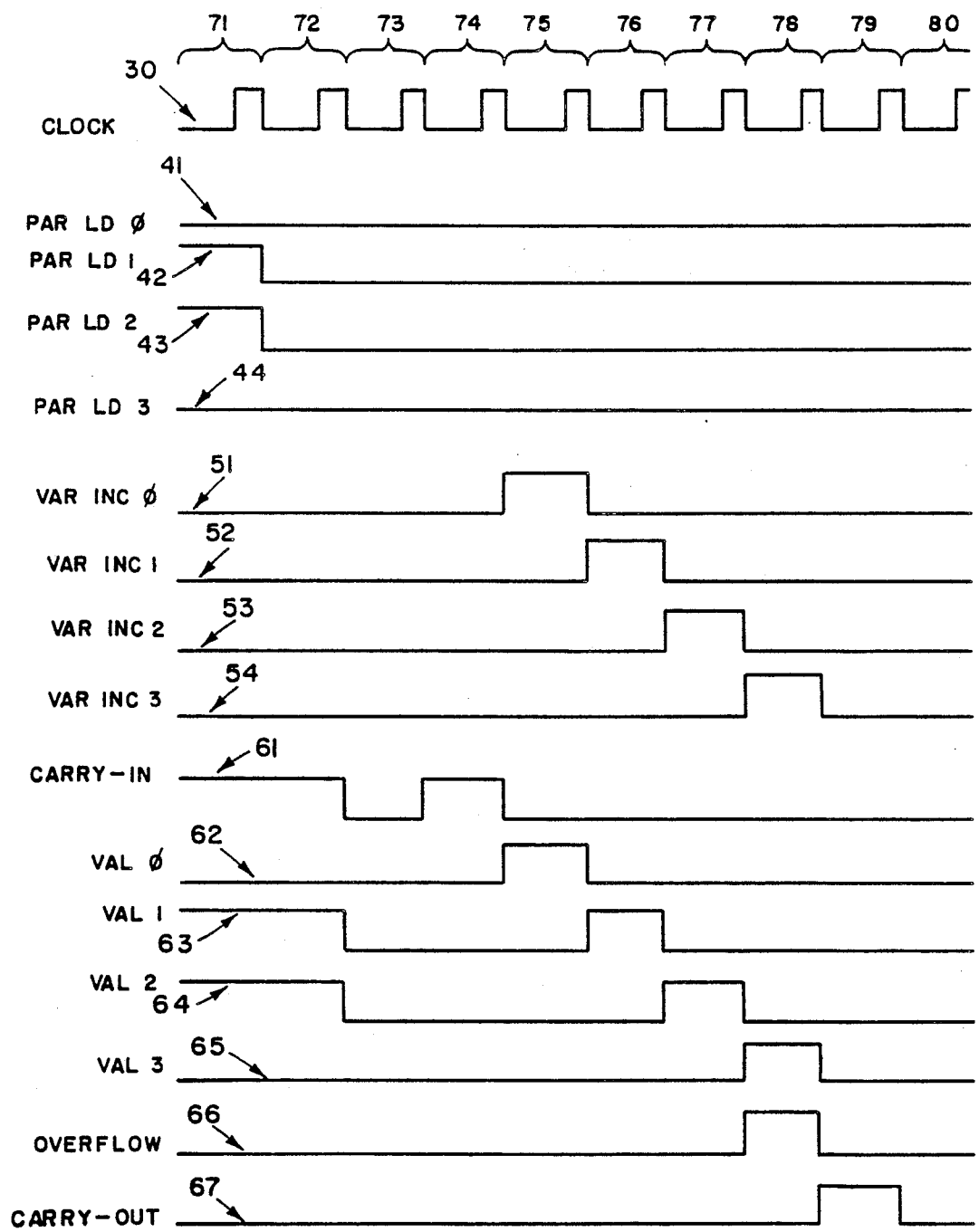
FIG. 2 consists of a plurality of digital signals which represent counter states (or values) during testing.

FIG. 2 shows a plurality of digital signals representing counter states (or values) during testing and comprises the inputs and outputs described and shown in FIG. 1. The signals are shown in to more completely describe operation of the method of testing the n-bit counter 10 of FIG. 1.

From top to bottom, FIG. 2 shows a clock input signal 30, four parallel load input signals 41, 42, 43, 44, four variable increment rate input signals 51, 52, 53, 54, a carry-in input signal 61, four register bit value signals 62, 63, 64, 65, an overflow output signal 66 and, a carry-out output signal 67.

The clock input signal 30 is associated with the clock input 24 of FIG. 1. The four parallel load input signals 41, 42, 43, 44 are associated with the parallel load input 20 of FIG. 1. The four variable increment rate input signals 51, 52, 53, 54 are associated with the variable increment rate input 22 of FIG. 1. The carry-in input signal 61 is associated with the carry-in input 12 of FIG. 1. The four register bit value signals 62, 63, 64, 65 are associated with the value register within the n-bit counter 10 of FIG. 1. The overflow output signal 66 is associated with the overflow output 14 of FIG. 1. Lastly , the carry-out signal 67 is associated with the carry-out output 16 of FIG. 1.

For purposes of FIG. 2, it is assumed that the n-bit wide counter is 4 bits wide. Thus, the parallel load input 20, the variable increment rate input 22, the register within the n-bit counter 10 and the linear feedback path 26, all of FIG. 1, are each 4 bits wide. Also, for purposes of FIG. 2, it is assumed that the n-bit counter 10 acts with respect to falling edges on the clock input signal 30 and, upon starting, the n-bit counter 10 contains a random value on the parallel load input 20 and in its register.

FIG. 2 has likewise been divided into temporal zones, designated 71, 72, 73, 74, 75, 76, 77, 78, 79, 80. These zones 71-80 are associated with pulses on the clock input signal 30 and represent the different states assumed within the n-bit counter 10 during operation of the test method of the subject invention.

In zone 71, the n-bit counter is powered up. Therefore, a random value exists in the parallel load input signals 41, 42, 43, 44, as evidenced by signals 41 and 44 being in a binary 0 state and signals 42 and 43 being in a binary 1 state. Accordingly, upon power up, the parallel load input 20 of FIG. 1 has assumed a random value of 6. Likewise, the register of the n-bit counter 10, represented by signals 62, 63, 64, 65, shows a value of binary 6 as evidenced by signals 62 and 65 being in a binary 0 state and signals 63 and 64 being in a binary 1 state. The carry-in signal 61 assumes a random binary 1 state and the overflow and carry-out signals 66, 67 assume a random binary zero state. Hadware (not shown) within the n-bit counter 10 sets the variable increment rate input signals 51, 52, 53, 54 to 0 upon power up.

In zone 72, a binary 0 is loaded into the parallel load input 20 of FIG. 1. Accordingly, parallel load signals 42 and 43 have been forced to a binary 0 state and parallel load signals 41 and 44, because they are already in a 0 state, remain 0.

In zone 73, a clock pulse has been issued causing the value of the parallel load input 20 to be forced into the register of the n-bit counter 10. Accordingly, signals 63 and 64, which were previously in a binary 1 state, now assume a binary 0 state. Therefore, the register, comprising signals 62, 63, 64, 65 has assumed an overall binary 0 state. Likewise, in zone 73, the carry-in signal 61 is set to zero. The n-bit counter 10 of FIG. 1 sets the overflow signal 66 and the carry-out signal 76 to binary 0 by virtue of there being a 0 value in the counter register.

In zone 74, a binary 1 is loaded into the carry-in input 12 of FIG. 1 to initiate the counter test. This binary 1 is represented by a change in state of the carry-in signal 61 of FIG. 2 in zone 74.

In zone 75, the binary 1 that was in the carry-in input 12 of FIG. 1 and represented by a binary 1 in the carry-in signal 61 is transferred to the register signal 62 and the carry-in signal 61 is returned to a binary 0 state. Because the signal 62 is now in a binary 1 state and a linear feedback path 26 of FIG. 1 has been established between the counter value output 18 and the variable increment rate input 22 of the n-bit counter 10 of FIG. 1, the variable increment signal 51 also assumes a binary 1 state.

In zone 76, the n-bit counter 10 of FIG. 1 is caused to increment by 1 because the variable increment rate input contains a value of binary 1. Accordingly, the register assumes a binary value 2 as represented by signal 63 achieving a binary 1 value and signal 62 achieving a binary 0 value. Likewise, due to the linear feedback path 26, the variable increment rate signal 52 achieves a binary 1 value and the signal 51 achieves a binary 0 value.

In zone 77, as in zone 76, the counter increments by an amount equal to the value of the variable increment rate input 22 of FIG. 1. Accordingly, the register value of 2 is incremented by 2 and becomes a 4, as represented by signal 64 achieving a binary 1 value and signal 63 achieving a binary 0 value. Likewise, signal 53 achieves a binary 1 value and signal 52 achieves a binary 0 value, thereby placing a value of 4 in the variable increment rate input 22 of FIG. 1.

In zone 78, the register value 4, as represented by the signal 64 being in a binary 1 state, is incremented by 4, represented by a binary 1 on the signal 53, and resulting in a value of 8 in the counter register, as represented by a binary 1 on signal 65. Because the n-bit counter is poised to overflow, hardware (not shown) within the n-bit counter 10 of FIG. 1 also sets the overflow signal 66 to a binary 1. Because of the linear feedback path 26, the variable increment rate signal 54 likewise achieves a binary 1 state.

In zone 79, the n-bit counter overflows, resulting in a binary 1 state being assumed by the carry-out signal 67. If the carry-out signal 67 assumes a binary 1 state in n+1 cycles following entry of a binary 1 state into the carry-in signal 61, the n-bit counter 10 is operating correctly.

In an alternative embodiment of the invention, intermediate values of the register of the n-bit counter 10 may be tested by monitoring the counter value output 18. For wide registers, this intermediate testing may provide a way of localizing errors which may occur within the register.

From the foregoing description it is apparent that the invention described provides a novel method of testing an n-bit programmable counter comprising the steps of resetting each bit of the counter to a 0 initial state, loading a different state into a carry-in bit of the counter and iteratively doubling the counter until a carry-out bit of the counter assumes the different state to thereby allow the counter to be fully tested in n+1 iterations.

Although this invention has been illustrated and described in connection with the particular embodiments illustrated, it will be apparent to those skilled in the art that various changes may be made therein without departing from the spirit of the invention as set forth in the appended claims.

I claim:

1. A method of testing an n-bit programmable counter, comprising the steps of:
    resetting each bit of said counter to a 0 initial state;
    loading a different state into a carry-in bit of said counter; and
    iteratively doubling said counter until a carry-out bit of said counter assumes said different state to thereby allow said counter to be fully tested in n+1 iterations.

2. The method as recited in claim 1 wherein said doubling is achieved by coupling a counter value output on said counter to a variable increment rate input on said counter and providing a clock pulse to a clock input on said counter.

3. The method as recited in claim 2 wherein said different state is a 1 state.

4. The method as recited in claim 3 wherein said counter value output and said variable increment rate input are decoupled when said counter is not being tested.

5. The method as recited in claim 4 wherein said counter is provided with a parallel load input to allow simultaneous resetting of said each bit.

6. The method as recited in claim 5 wherein said counter is provided with an overflow output.

7. The method as recited in claim 6 wherein intermediate counter values are checked to localize errors within said counter.

8. An n-bit programmable counter configured for testing, comprising:
    means for resetting each bit of said counter to a 0 initial state;
    means for loading a different state into a carry-in bit of said counter; and
    means for coupling a counter value output on said counter to a variable increment rate input on said counter and providing a clock pulse to a clock input on said counter to thereby iteratively double said counter until a carry-out bit of said counter assumes said different state to allow said counter to be fully tested in n+1 iterations.

9. The counter as recited in claim 8 wherein said different state is a 1 state.

10. The counter as recited in claim 9 wherein said counter value output and said variable increment rate input are decoupled when said counter is not being tested.

11. The counter as recited in claim 10 wherein said counter is provided with a parallel load input to allow simultaneous resetting of said each bit.

12. The counter as recited in claim 11 wherein said counter is provided with an overflow output.

13. The counter as recited in claim 12 wherein intermediate counter values are checked to localize errors within said counter.

14. A method of testing an n-bit programmable counter, comprising the steps of:
resetting each bit of said counter to a binary 0 initial state;
loading a binary 1 state into a carry-in bit of said counter; and
iteratively doubling said counter until a carry-out bit of said counter assumes said binary 1 state, said doubling achieved by coupling a counter value output on said counter to a variable increment rate input on said counter and providing a clock pulse to a clock input on said counter to thereby allow said counter to be fully tested in $n+1$ iterations.

15. The method as recited in claim 14 wherein said counter value output and said variable increment rate input are decoupled when said counter is not being tested.

16. The method as recited in claim 15 wherein intermediate counter values are checked to localize errors within said counter.

* * * * *